United States Patent
Galli et al.

(10) Patent No.: US 7,143,012 B2
(45) Date of Patent: Nov. 28, 2006

(54) METHOD AND DEVICE FOR FILTERING SIGNALS PRODUCED BY AN ACCELEROMETER OF THE PIEZO-ELECTRIC TYPE, AND APPLICATION TO A PORTABLE OBJECT SUCH AS A WATCH

(75) Inventors: Reto Galli, Bern (CH); Mathias Peguiron, Neuchâtel (CH); Yves Godat, Cornaux (CH); Nicolas Jeannet, Chambrelien (CH)

(73) Assignee: EM Microelectronic-Marin SA, Marin (CH)

( * ) Notice: Subject to any disclaimer, the term of this patent is extended or adjusted under 35 U.S.C. 154(b) by 1 day.

(21) Appl. No.: 10/951,692

(22) Filed: Sep. 29, 2004

(65) Prior Publication Data

US 2005/0071133 A1    Mar. 31, 2005

(30) Foreign Application Priority Data

Sep. 29, 2003   (EP)   .................................. 03021920

(51) Int. Cl.
   *G01P 15/09*   (2006.01)
(52) U.S. Cl. ...................... 702/193; 702/141; 702/190; 702/176; 73/12.01
(58) Field of Classification Search ................ 702/193, 702/41, 42, 79, 66, 69, 71, 73, 56, 113, 116, 702/124, 125, 141, 176–178, 189–191, 197; 73/649, 12.01, 12.04, 12.09, 12.12, 11.01, 73/488, 489, 493, 503; 340/573.6, 665, 683, 340/436

See application file for complete search history.

(56) References Cited

U.S. PATENT DOCUMENTS

| 3,961,271 | A |   | 6/1976  | Zlyda .......................... 327/37    |
|-----------|---|---|---------|--------------------------------------------|
| 4,745,564 | A | * | 5/1988  | Tennes et al. .............. 702/141       |
| 5,197,489 | A |   | 3/1993  | Conlan ........................ 600/595    |
| 5,631,427 | A | * | 5/1997  | Bridges ........................ 73/658    |
| 5,760,691 | A |   | 6/1998  | Egli ........................ 340/573.6    |
| 5,982,573 | A | * | 11/1999 | Henze .......................... 360/75    |
| 6,138,516 | A | * | 10/2000 | Tillman ........................ 73/649    |
| 6,353,579 | B1|   | 3/2002  | Ciervo ........................ 368/67     |
| 6,539,336 | B1| * | 3/2003  | Vock et al. ................. 702/182      |
| 6,553,807 | B1| * | 4/2003  | Luk et al. .................. 73/12.09     |

FOREIGN PATENT DOCUMENTS

EP    0 280 254        8/1988
EP    1 187 330 A2     3/2002

* cited by examiner

*Primary Examiner*—Hal Wachsman
(74) *Attorney, Agent, or Firm*—Griffin & Szipl, P.C.

(57) ABSTRACT

The invention concerns a method for filtering signals ($V_{in}$) generated by a piezo-electric type accelerometer in response to detection of a shock applied to an object to which the accelerometer is connected, this method characterised in that it ensures, during a particular step, that the signal ($V_{in}$) generated by the accelerometer, after having increased and exceeded a first threshold value ($V_{TH,ON}$) decreases and becomes lower than a second threshold value ($V_{TH,OFF}$) lower than the first threshold value ($V_{TH,ON}$) after a period of time ($T_{P,ON}$) greater than a minimum period of time ($T_{P,ON,MIN}$) and less than a maximum period of time ($T_{P,ON,MAX}$). The invention also concerns a device for filtering signals generated by an accelerometer in response to detection of a shock applied to an object connected to the accelerometer. Finally, the invention concerns a portable object such as a wristwatch including a detection device of this kind.

24 Claims, 3 Drawing Sheets

METHOD AND DEVICE FOR FILTERING SIGNALS PRODUCED BY AN ACCELEROMETER OF THE PIEZO-ELECTRIC TYPE, AND APPLICATION TO A PORTABLE OBJECT SUCH AS A WATCH

This application claims priority from European Patent Application No 03021920.8 filed Sep. 29, 2003, the entire disclosure of which is incorporated herein by reference.

FIELD OF THE INVENTION

The present invention concerns a method for filtering electric signals generated by a piezo-electric type accelerometer in response to a mechanical shock. The present invention also concerns a device for implementing said method. The present invention finally concerns the application of such a device to a portable object such as a watch.

BACKGROUND OF THE INVENTION

There is known, from U.S. Pat. No. 5,760,691, granted 2 Jun. 1998 in the name of the Scubapro Company, a diving instrument including a liquid crystal display device housed in a sealed manner in a transparent case. The diving instrument also includes an accelerometer capable of detecting a shock applied to the case. In response to detection of a shock, the accelerometer generates a signal, which switches on a backlighting device for the liquid crystal cell.

The Scubapro invention removes the need to use of a push-button for controlling the lighting of the liquid crystal cell display device, which is particularly advantageous for a diving instrument. Indeed, divers frequently wear thick gloves, which make it awkward for them to manipulate a push-button.

However, one has to ensure that the display device lighting is not inadvertently switched on in response to an involuntary shock, since this would affect the life span of the energy source, typically a lithium battery, which provides the diving instrument with current. In order to overcome this problem, Scubapro propose using a pass-band filter whose role is to filter the characteristic signals generated by the accelerometer in response to a shock applied to the case. The filter has to prevent the electric signals from the accelerometer and corresponding, for example, to abrasion noise, causing the lighting means of the display cell to be switched on. For this purpose, Scubapro has determined that the frequency of the signals generated by the accelerometer in response to a deliberate shock applied to the case using a finger is comprised between an interval ranging from 6 to 25 kHz. It is for this reason that the high cut-off frequency of the pass-band filter was fixed at 25 kHz, and its low cut-off frequency is 6 kHz.

The filtering method used by Scubapro is quite precipitant. It is not, in fact, difficult to imagine that numerous shocks, for example of the diving instrument against a stone or any other solid body, will induce an accelerometer frequency response comprised in the range 6 kHz–25 kHz, and thus cause the display device lighting means to inadvertently be switched on.

It is an object of the present invention to overcome this problem, in addition to others, by proposing a method for filtering signals generated by a piezo-electric type accelerometer in response to a shock which allows deliberate shocks to be more reliably differentiated from unintentional inadvertent shocks.

SUMMARY OF THE INVENTION

The present invention thus concerns a method for filtering signals generated by a piezo-electric type accelerometer in response to detection of a shock applied to an object to which the accelerometer is linked, this method being characterised in that it is ensured that, during a first step, the signal generated by the accelerometer, after having increased and exceeded a first threshold value, decreases and becomes less than a second threshold value lower than the first threshold value after a period of time greater than a minimum and less than a maximum.

Owing to these features, the present invention provides a method for filtering signals generated by a piezo-electric accelerometer in response to detection of a shock, which allows deliberate shocks to be more reliably differentiated from inadvertent shocks. The advantage of the present invention lies in its application to a portable object, such as a portable telephone or a timepiece. In the case of a timepiece, for example, the present invention allows a deliberate shock applied to the glass by means of a finger to be differentiated from inadvertent shocks, for example, when the watch hits a solid object such as a table or when the person wearing the watch claps his hands. By providing such a precise filtering method, the present invention prevents a function, for example switching on the lighting means for the time display device of the watch, being inadvertently switched on, which allows considerable energy savings to be made and prolongs the life of the energy source, for example a battery or a rechargeable accumulator, which supplies the watch with current.

According to a complementary feature of the method, during a second step following the first step, it is ensured that the signal generated by the accelerometer remains lower than the first threshold value during a period of time equal to a third predetermined value.

The present invention also concerns a device for filtering signals generated by a piezo-electric type accelerometer in response to detection of a shock applied to an object to which the accelerometer is linked, this device being characterised in that:

comparison means for comparing the level of the signal generated by the accelerometer to a first threshold level and a second threshold level;

means for switching on a time base which is operated when the level of the signal from the accelerometer supplied to the comparison means is higher than the first threshold level;

a generator of reference time periods controlled by the time base, and means for checking over time the output level of the comparison means in relation to the reference time periods provided by the generator to determine whether the shock applied to the object was deliberate or not.

Finally, the present invention concerns a portable object, such as a timepiece, including a filtering device of the type described hereinbefore, characterised in that, if the checking means determine that the shock applied to the object is deliberate, they generate a control signal for switching on a function of the portable object.

BRIEF DESCRIPTION OF THE DRAWINGS

Other features and advantages of the present invention will appear more clearly from the following detailed description of an example implementation of the method according to the invention, this example being given solely by way of non-limiting illustration, in conjunction with the annexed drawing, in which.

DETAILED DESCRIPTION OF ILLUSTRATIVE EMBODIMENTS OF INVENTION

The present invention proceeds from the general inventive idea consisting in providing a method for filtering the signals generated by a piezo-electric type accelerometer in response to a shock exerted on an object with which the accelerometer is associated, which enables deliberate shocks to be reliably distinguished from unintentional inadvertent shocks. If a valid shock is detected, the circuit for implementing the present invention will generate a signal for controlling an electric or electronic function of the object. This may be, for example, if the object is a watch, switching on the lighting means of the time display device by applying a shock to the watch glass by a finger. Thus, by preventing the lighting means being inadvertently switched on, the method according to the invention allows substantial savings to be made in terms of electric power consumption, which increases the life of the energy source, conventionally a battery or rechargeable accumulator, which powers the object.

The present invention will be described with reference to a timepiece of the wristwatch type. It goes without saying that this example is given solely by way of illustration and that the invention can also be applied to any type of object provided with an electrical or electronic function such as, particularly, a portable telephone.

Figure 1:
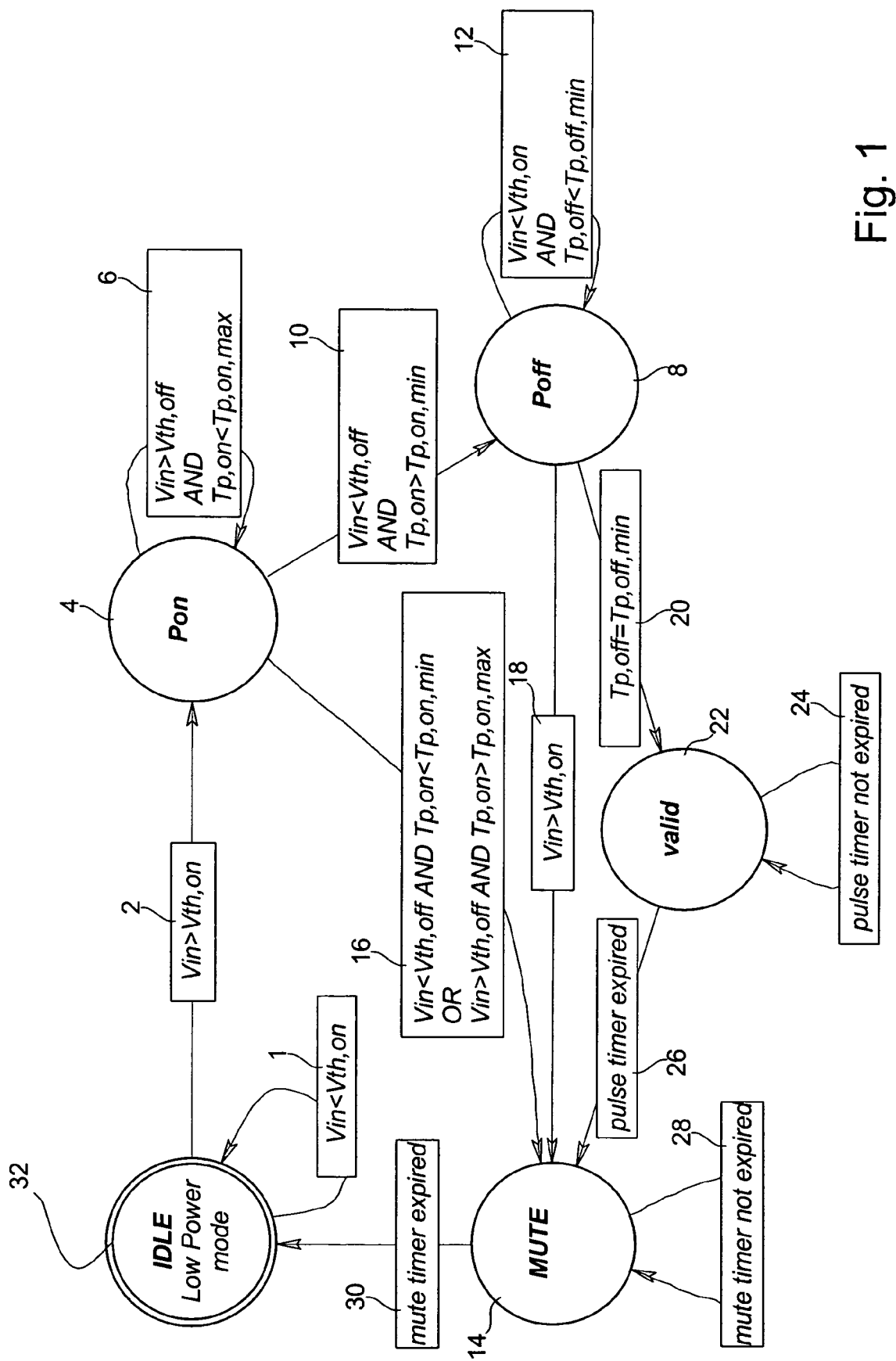
FIG. 1 is a state diagram of the detection circuit.

Reference will be made first of all to FIG. 1, which is a state diagram of the detection circuit. For as long as voltage $V_{IN}$ at the terminals of the piezo-electric accelerometer remains less than a first threshold value $V_{TH,ON}$, the system is on standby (step 1). At 2, an impact force has been applied to the object such that voltage $V_{IN}$ at the terminals of the accelerometer becomes higher than threshold value $V_{TH,ON}$. The system then enters active mode $P_{ON}$ illustrated at 4.

After having increased, voltage $V_{IN}$ begins to decrease. At 6, there is shown a condition for maintaining the detection circuit in its active mode 4. This maintenance condition is defined by two criteria which have to be met simultaneously. These criteria force voltage $V_{IN}$ to remain higher than a second threshold value $V_{TH,OFF}$ lower than first threshold value $V_{TH,ON}$, for a period of time $T_{P,ON}$ lower than a maximum value $T_{P,ON,MAX}$. As soon as one of these conditions is no longer being fulfilled, the detection circuit will itself pass either to a mute state, or to a second active state as described in detail hereinafter.

As voltage $V_{IN}$ at the terminals of the accelerometer continues to decrease, let us assume that it becomes lower than threshold value $V_{TH,OFF}$. The detection circuit can then pass to second active mode $P_{OFF}$ illustrated at 8, provided that transition condition 10, which requires voltage $V_{IN}$ to remain lower than threshold value $V_{TH,OFF}$ for a minimum period of time $T_{P,ON}$ higher than a value $T_{P,ON,MIN}$, which is itself lower than the period of time $T_{P,ON,MAX}$.

At 12, there is shown a second condition for maintaining detection circuit in its active mode 8. This maintenance condition requires voltage $V_{IN}$ not to bounce and to remain lower than the first threshold value $V_{TH,ON}$ for a period of time $T_{P,OFF}$ that is at least equal to a third threshold value $T_{P,OFF,MAX}$.

If one of the two conditions stated at 6 is not met, the system can enter a mute mode shown at 14 in which it does not accept any new shocks. Indeed, as indicated at 16, if voltage $V_{IN}$ at the terminals of the piezo-electric accelerometer is higher than $V_{TH,OFF}$ but for a period of time $T_{P,ON}$ lower than period of time $T_{P,ON,MIN}$ or if voltage $V_{IN}$ is higher than $V_{TH,OFF}$, but for a period of time $T_{P,ON}$ higher than value $T_{P,ON,MAX}$, the shock applied to the object is not recognised as valid.

If, while the system is in active mode $P_{OFF}$ shown at 8, voltage $V_{IN}$ at the accelerometer terminals has a bounce which causes it to exceed threshold voltage $V_{TH,ON}$ as indicated at 18 after a period of time $T_{P,OFF}$ less than $T_{P,OFF,MIN}$, the system directly enters mute mode at 14 in which it does not accept any new shocks. The particular advantage of this arrangement is that it prevents the system considering the end of a series of bounces of voltage $V_{IN}$ as being a valid shock. Indeed, in the event of a shock to a watch against a hard surface like a table for example, the first bounce of voltage $V_{IN}$ could be dismissed by the system as not corresponding to a valid shock, but the following bounce could, however, fulfil the conditions required and be accepted by the system as corresponding to a valid shock. Thus, the system output would become active while the initial shock was unintentional.

Conversely, if voltage $V_{IN}$ remains lower than threshold voltage $V_{TH,ON}$ for a period of time $T_{P,OFF}$ at least equal to value $T_{P,OFF,MIN}$ as shown at 20, then the shock applied to the object is recognised as deliberate and the system enters the validation mode as indicated at 22. In this mode, the system output becomes active and remains so until a time delay indicated at 24 has elapsed. It goes without saying that during the period of time during which the system output remains active, said system does not accept any new shocks. When the output of the system becomes inactive again after the time delay as indicated at 24, the system enters mute mode 14 and remains in said mode until a time delay indicated at 28 has elapsed. When the time delay elapses (step 30), the system returns to its standby state (step 32) ready to detect a new shock.

FIGS. 2a to 2d show, over time, the characteristic aspect of the signals generated by the piezo-electric generator depending upon the nature of the shock applied to the object.

Figure 2A:
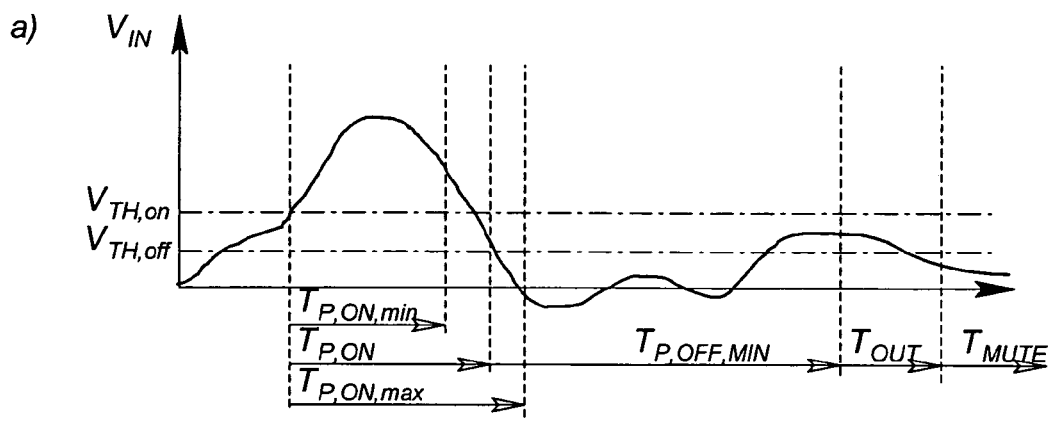
FIGS. 2a to 2d show, as a function of time, the characteristic aspect of the signals generated by the accelerometer depending on the nature of the shock applied to the object.

FIG. 2a corresponds to a valid shock. Voltage $V_{IN}$ at the accelerator terminals starts by exceeding the threshold value $V_{TH,ON}$. After having increased and being exceeded through a maximum, voltage $V_{IN}$ starts to decrease. It becomes lower than threshold value $V_{TH,OFF}$ after a period of time $T_{P,ON}$ lower than the value $T_{P,OFF,MAX}$ and higher than the value $T_{P,OFF,MIN}$. Afterwards, voltage $V_{IN}$ at the accelerator terminals has no bounce and remains lower than threshold value $V_{TH,ON}$ for a period of time $T_{P,OFF}$ which will at least equal the value $T_{P,OFF,MIN}$. Since the shock is recognised as valid, the system output becomes active for a period of time $T_{OUT}$. When the system output becomes inactive again, the system enters a mute mode for a period of time $T_{MUTE}$ during which said system does not accept any new shocks.

Figure 2B:
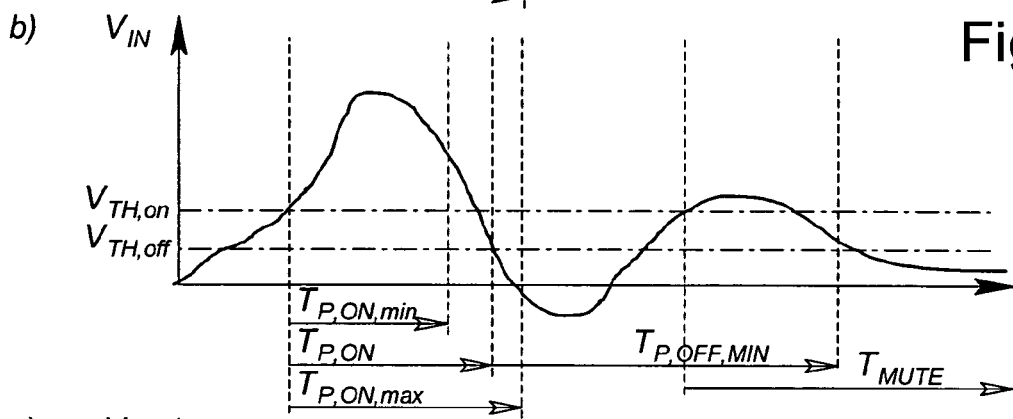

FIG. 2b corresponds to an invalid shock, typically generated by contact of the object with a hard surface. It can be seen, upon examining FIG. 2b that voltage $V_{IN}$ starts by having a satisfactory profile as in FIG. 2a until, having decreased beyond threshold value $V_{TH,OFF}$ it starts to increase again and to exceed threshold value $V_{TH,ON}$ again after a period of time $T_{P,OFF}$ less than the value $T_{P,OFF,MIN}$.

As soon as voltage $V_{IN}$ has a bounce and exceeds threshold value $V_{TH,ON}$ for a second time, the system enters its mute mode in which it does not accept any new shocks during a period of time $T_{MUTE}$.

Figure 2C:
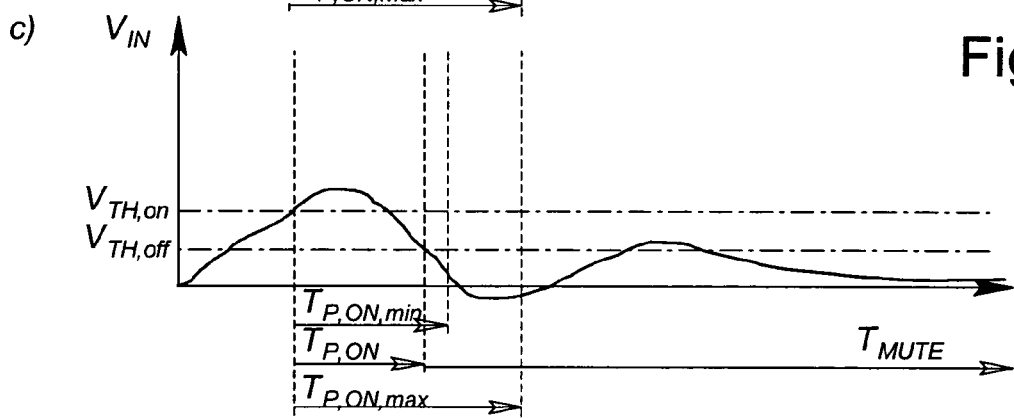

FIG. 2c corresponds to another invalid shock, because it is too slight. Indeed, if voltage $V_{IN}$ at the accelerometer terminals starts by exceeding the threshold value $V_{TH,ON}$ it decreases quickly and becomes lower than the second threshold value after a period of time $T_{P,ON}$ which is less than $T_{P,OFF,MIN}$ which is not sufficient. The signal is thus not recognised as valid and it is rejected by the system that enters a mute mode in which it does not accept any new shocks during a period of time $T_{MUTE}$.

Figure 2D:
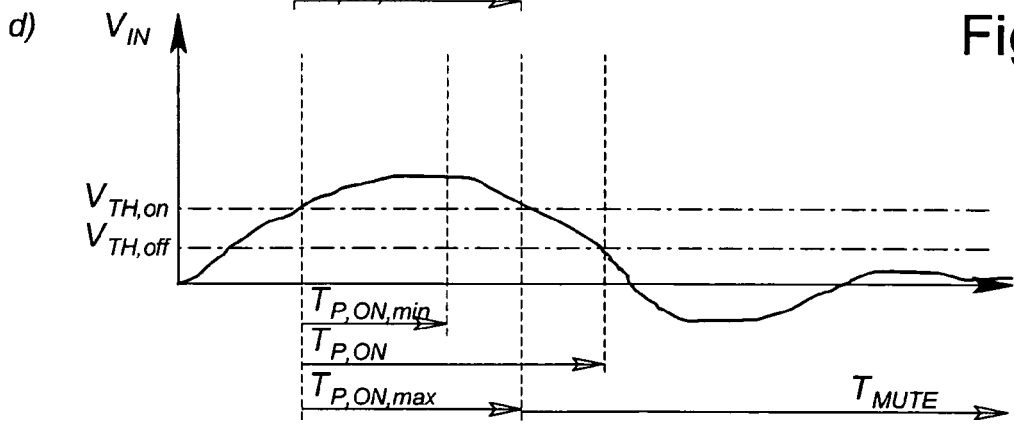

Finally, FIG. 2d also corresponds to an invalid shock, typically produced by contact of the object against a flexible surface or when the user is applauding, where the object is a wristwatch. It can be observed, in fact, upon examining FIG. 2d, that after having exceeded threshold value $V_{TH,ON}$, voltage $V_{IN}$ remains higher than the second threshold value $V_{TH,OFF}$ during a period of time $T_{P,ON}$ greater than value $T_{P,ON,MAX}$. The signal is thus not recognised as valid and it is rejected by the system that enters a mute mode in which it does not accept any new shocks during a period of time $T_{MUTE}$.

Figure 3:
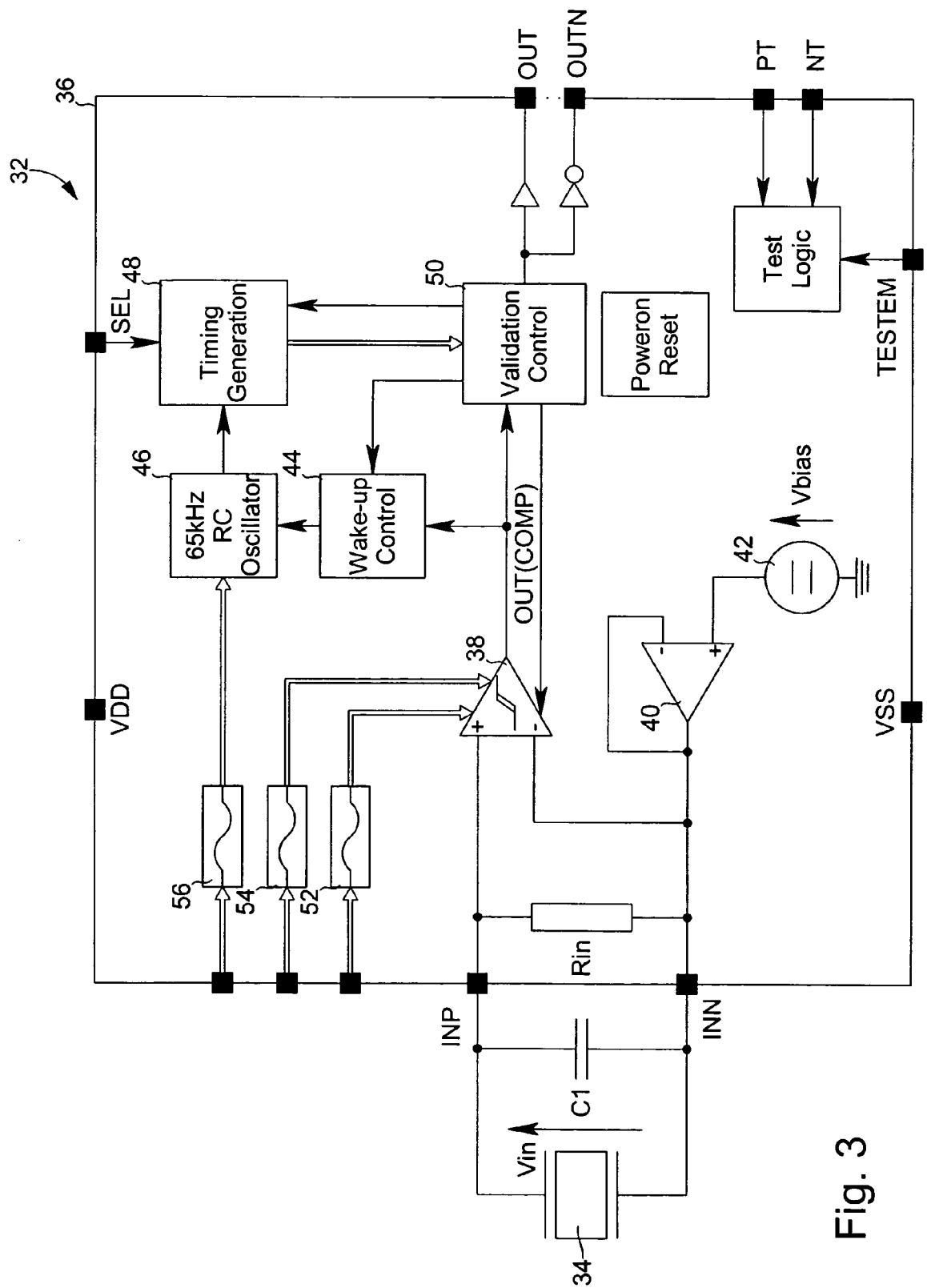
FIG. 3 is a block diagram of the detection circuit.

FIG. 3 is a block diagram of the detection circuit. Designated as a whole by the general reference numeral 32, this circuit includes a piezo-electric type accelerometer marketed by the Murata Company, under the reference PKGS 90LC. Under the effect of a shock, this accelerometer produces a current, which is converted into a voltage signal $V_{IN}$ by its own capacitance. A capacitor C1 is mounted in parallel to the terminals of the accelerometer. This capacitor C1, which can take different values, is mounted outside an integrated circuit 36 and allows detection circuit 32 to always see the same signal regardless of the application for which the detection circuit 32 is intended. For example, in the case of a watchmaking application, detection circuit 32 will see the same signal whether the watchcase is made of plastic or metal. A resistor $R_{IN}$ is also mounted in parallel to the terminals of accelerometer 34, but forms part of integrated circuit 36. This resistor is for allowing the positive input of a comparator 38 to be brought, at rest, to the same potential as its negative input. A follower circuit 40, whose positive input is connected to a reference voltage source 42, generates a voltage comprised between the negative and positive supply potentials, respectively $V_{SS}$ and $V_{DD}$, of integrated circuit 36 the voltage being used for polarising one of the terminals of accelerometer 34 and the negative input of comparator 38, and whose value will preferably but not restrictively fixed in proximity to 700 mV.

Comparator 38 is a hysteresis comparator having two threshold values respectively $V_{TH,OFF}$ and $V_{TH,ON}$. Depending upon which step of the filtering method one is at, voltage $V_{IN}$ at the terminals of accelerometer 34 will be compared to one or other of these two threshold values. Threshold value $V_{TH,OFF}$ preferably corresponds to a difference in potential between the input terminals of comparator 38 of the order of 0V+/−5 mV, whereas threshold value $V_{TH,ON}$ can be fixed in proximity to 30 mV+/−2 mV.

Let us assume that the level of signal $V_{IN}$ supplied by accelerometer 34 to comparator 38 is higher than the first threshold level $V_{TH,ON}$ just after detection of a shock. In such case, the shock is considered a priori valid and the output OUT(COMP) of comparator 38 passes to a high level. In response to this signal, a starting circuit 44 actuates a time base 46, which includes an oscillator RC whose clock frequency is fixed at 65 kHz. This time base 46 supplies a clock signal to a period of time generator 48, in other words a division chain, which counts down the time and ensures that the duration of pulse $V_{IN}$ produced by accelerometer 34 is less than a maximum period of time $T_{P,ON,MAX}$ and greater than a maximum period of time $T_{P,ON,MIN}$. Minimum and maximum periods of time $T_{P,ON,MIN}$ and $T_{P,ON,MAX}$ have the respective values 0.488 ms and 5.127 ms. Time period generator 48 also generates period of time $T_{P,OFF}$ during which pulse $V_{IN}$ produced by accelerometer 34 has to remain lower than threshold value $V_{TH,ON}$ so that the signal is recognised as valid. In practice, when signal $V_{IN}$ has exceeded threshold value $V_{TH,ON}$, the comparator threshold level will be fixed at $V_{TH,OFF}$ and vice versa. Period of time $T_{P,OFF}$ has a value of 5.127 ms. Moreover, the period of time $T_{MUTE}$ during which the system does not accept any new shocks is fixed at 46.8 ms.

Finally, a checking circuit 50 checks whether pulse $V_{IN}$ is valid in accordance with the method illustrated in conjunction with FIG. 1. If this is the case, its output OUT passes to a high level during a period of time $T_{OUT}$ determined by period of time generator 48. $T_{OUT}$ thus determines the period of time during which a function remains activated or during which the digital output of checking circuit 50 remains applied to an input of a microcontroller. Once this waiting time has passed, the output of checking circuit 50 returns to an inactive low level and the system remains insensitive to shocks for an additional period of time $T_{MUTE}$ determined by period of time generator 48. If the shock is not recognised as valid, the system immediately passes into its mute state for the period of time $T_{MUTE}$. It will also be noted that it is also a function of checking circuit 50 to indicate to comparator 38 which of its two high or low levels $V_{TH,ON}$ or $V_{TH,OFF}$ it has to compare to voltage $V_{IN}$ present at the terminals of accelerometer 34.

Finally, fuses 52, 54, 56 are provided, which, for a given integrated circuit, allow thresholds $V_{TH,ON}$, $V_{TH,OFF}$ and the frequency of clock circuit 46 to be adjusted.

It goes without saying that the present invention is not limited to the implementation that has just been described, and that various simple modifications and variants can be envisaged by those skilled in the art without departing from the scope of the present invention.

What is claimed is:

1. A method for filtering one or more signals generated by a piezo-electric type accelerometer in response to detection of a shock applied to an object to which the piezo-electric type accelerometer is connected, wherein the method comprises the steps of:
    generating a signal by a piezo-electric type accelerometer in response to detection of a shock applied to an object connected to the piezo-electric type accelerometer; and
    filtering, during a second step, the signal generated by the piezo-electric type accelerometer to ensure that, after having increased and exceeded a first threshold value, the signal decreases and becomes lower than a second threshold value that is lower than the first threshold value after a first period of time greater than a minimum period of time and less than a maximum period of time.

2. The method according to claim 1, wherein the method further comprises the step of:
    ensuring, during a third step following the second step, that the signal generated by the piezo-electric type accelerometer remains lower than the first threshold value for a period of time that is at least equal to a first predetermined value.

3. The method according to claim 2, wherein, if the signal generated by the piezo-electric type accelerometer remains higher than the second threshold value after a period of time less than the minimum period of time, or if the signal remains higher than the second threshold value, but for a period of time greater than the maximum period of time, the shock is not recognised as valid.

4. The method according to claim 3, wherein if the signal after the second step, becomes higher than the first threshold value again, after a time less than the minimum period of time, the shock is not recognised as valid.

5. The method according to claim 2, wherein if the signal after the second step, becomes higher than the first threshold value again, after a time less than the period of time, the shock is not recognised as valid.

6. The method according to claim 1, wherein, if the signal generated by the piezo-electric type accelerometer remains higher than the second threshold value after a period of time less than the minimum period of time, or if the signal remains higher than the second threshold value, but for a period of time greater than the maximum period of time, the shock is not recognised as valid.

7. The method according to claim 6, wherein if the signal after the second step, becomes higher than the first threshold value again, after a time less than the period of time, the shock is not recognised as valid.

8. A device for filtering signals generated by a piezo-electric type accelerometer in response to detection of a shock applied to an object to which the piezo-electric type accelerometer is connected, wherein this device includes:
   comparison means for comparing a level of a voltage signal generated by a piezo-electric type accelerometer, connected to the object, to a first threshold level and a second threshold level;
   means for switching on a time base, wherein the time base is actuated by the means for switching on the time base when the level of the voltage signal from the piezo-electric type accelerometer supplied to the comparison means is higher than the first threshold level;
   a generator of reference time periods controlled by the time base; and
   means for checking, over time, an output level of the comparison means in relation to the reference periods of time provided by the generator to determine whether a shock applied to the object is valid or not.

9. The device according to claim 8, wherein the generator of reference time periods generates the following period of times:
   a minimum period of time and a maximum period of time between which there must be comprised a period of time after which the voltage signal becomes lower than the second threshold level after having exceeded the first threshold level;
   a first predetermined value of time during which the voltage signal must not exceed the first threshold level again;
   a first time delay during which a function remains activated or during which a digital output of a checking circuit remains applied to an input of a microcontroller; and
   a second time delay during which the filtering device does not accept any new shocks.

10. The device according to claim 9, wherein:
    the minimum period of time has a value of 0.488 ms;
    the maximum period of time has a value of 5.127 ms;
    the period of time of the first predetermined value has a value of 5.1 27 ms; and
    the period of time of the first time delay has a value of 46.8 ms.

11. The device according to claim 8, wherein the device further includes an integrated circuit comprising the time base.

12. The device according to claim 11, wherein a capacitor is mounted in parallel across terminals of the piezo-electric type accelerometer outside the integrated circuit so the comparison means always see the same signal regardless of the application for which the filtering device is intended.

13. The device according to claim 11, wherein the device further includes a follower circuit connected to a reference voltage source which generates a voltage comprised between the negative and positive supply potentials of the integrated circuit, said voltage being used to polarise one terminal of the-terminals of the piezo-electric type accelerometer and one terminal of the-terminals of the comparison means.

14. The device according to claim 13, wherein the voltage generated by the follower circuit is fixed in proximity to 700 mV.

15. The device according to claim 8, wherein the comparison means include a hysteresis comparator having two threshold values, respectively the first threshold level and the second threshold level.

16. The device according to claim 15, wherein a resistor is mounted in parallel to terminals of the comparison means, wherein when the filtering device is at rest, the terminals of the comparison means are at the same potential.

17. The device according to claim 8, wherein the time base includes an RC oscillator.

18. The device according to claim 17, wherein the clock frequency of the RC oscillator is fixed at 65 kHz.

19. The device according to claim 8, wherein the generator of reference time periods includes a chain division which counts down time.

20. The device according to claim 8, wherein the checking means also functions to indicate to the comparison means which one of the first threshold level and the second threshold level has to be compared to the voltage signal generated by the piezo-electric type accelerometer.

21. The device according to claim 8, wherein the device further includes fuses operably connected to the time base to allow the first threshold level, the second threshold level, and the clock frequency of the time base to be adjusted.

22. The device according to claim 8, wherein the second threshold level corresponds to a potential difference of the order of 0V+/−5 mV, and the first threshold level is fixed in proximity to 30 mV+/−2 mV.

23. A portable object including a filtering device according to claim 8, wherein, when the checking means determine that the shock applied to the object is valid, the filtering device generates a control signal for switching on a function of the portable object.

24. A wristwatch including a filtering device according to claim 8, wherein, when the checking means determine that the shock applied to the object is valid, the filtering device generates a control signal for switching on a function of the wristwatch.

* * * * *